United States Patent
Kokkosoulis et al.

(10) Patent No.: US 6,498,855 B1
(45) Date of Patent: Dec. 24, 2002

(54) METHOD AND SYSTEM FOR SELECTIVELY AND VARIABLY ATTENUATING AUDIO DATA

(75) Inventors: George Kokkosoulis, Austin, TX (US); Daniel Anthony Temple, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/061,985

(22) Filed: Apr. 17, 1998

(51) Int. Cl.$^7$ .............................. H03G 7/00; H03G 3/00; G06F 17/00

(52) U.S. Cl. ......................... 381/106; 381/104; 700/94

(58) Field of Search ................................. 381/104, 106, 381/107, 109; 700/94; 330/14

(56) References Cited

U.S. PATENT DOCUMENTS 5,883,963 A * 3/1999 Tonella ..................... 381/104

* cited by examiner

Primary Examiner—Forester W. Isen
Assistant Examiner—Elizabeth McChesney
(74) Attorney, Agent, or Firm—Casimer K. Salys; Bracewell & Patterson, L.L.P.

(57) ABSTRACT

A method and system for selectively and variably attenuating audio data are disclosed. A high-volume control value as selected by a user is first received, and this high-volume control value defines a volume output level for high amplitude audio samples. An attenuation factor is then determined by utilizing the high-volume control value. Each sample from an incoming audio data stream is conditionally attenuated with the attenuation factor such that high amplitude audio data get compressed while low amplitude audio data remain unaffected. Finally, the attenuated samples are sent to an output.

9 Claims, 2 Drawing Sheets

METHOD AND SYSTEM FOR SELECTIVELY AND VARIABLY ATTENUATING AUDIO DATA

BACKGROUND OF THE INVENTION

1. Technical Field

The present invention relates to a method and system for data processing in general, and in particular to a method and system for attenuating audio data. Still more particularly, the present invention relates to a method and system for selectively and variably attenuating audio data.

2. Description of the Prior Art

In recent years, home theater systems have become more pervasive in the consumer electronics market; and home video enthusiasts are constantly demanding better performance in their new home theater systems. Catering to this ever increasing demand, there have been tremendous technological improvements in home theater systems, such as digital versatile disks (DVD), wide-screen televisions, surround sound™ audio systems, etc. All this enhanced video and audio equipment is intended to provide an audience with a theater-like feel during a video presentation at their own home. For example, with DVDs and a well-equipped surround sound™ audio system, a home audience can experience various sound effects from a movie playing in a home theater system as if he were watching the same movie in a theater.

Be that as it may, one of the many aspects of a video presentation that a home theater system must handle is the volume control for the audio portion of the presentation. For example, in an action-oriented movie, there is a great amplitude difference between the loudest and quietest passages in the movie. As a result, if the volume level of the audio system is set at a relatively high level such that the typically quiet dialogue can be intelligible, then the scenes including loud sound effects, such as explosions and car chases, will be too loud for the home audience or annoy other people such as a next door neighbor. Sometimes, extremely high amplitude audio output may even cause speaker damage. If, on the other hand, the volume level is adjusted to a relatively low level, then the softly spoken dialogue may not be easily discernable. Consequently, it would be desirable to provide a method to perform a dynamic audio range compression of audio data, such that high amplitude audio data get compressed by a user-selectable amount while low amplitude audio data remain unaffected.

SUMMARY OF THE INVENTION

In view of the foregoing, it is therefore an object of the present invention to provide an improved method and system for data processing.

It is another object of the present invention to provide an improved method and system for attenuating audio data.

It is yet another object of the present invention to provide an improved method and system for selectively and variably attenuating audio data.

In accordance with a method and system of the present invention, a high-volume control value as selected by a user is first received, and this high-volume control value defines a volume output level for high amplitude audio samples. An attenuation factor is then determined by utilizing the high-volume control value. Each sample from an incoming audio data stream is conditionally attenuated with the attenuation factor such that high amplitude audio data get compressed while low amplitude audio data remain unaffected. Finally, the attenuated samples are sent to an output.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
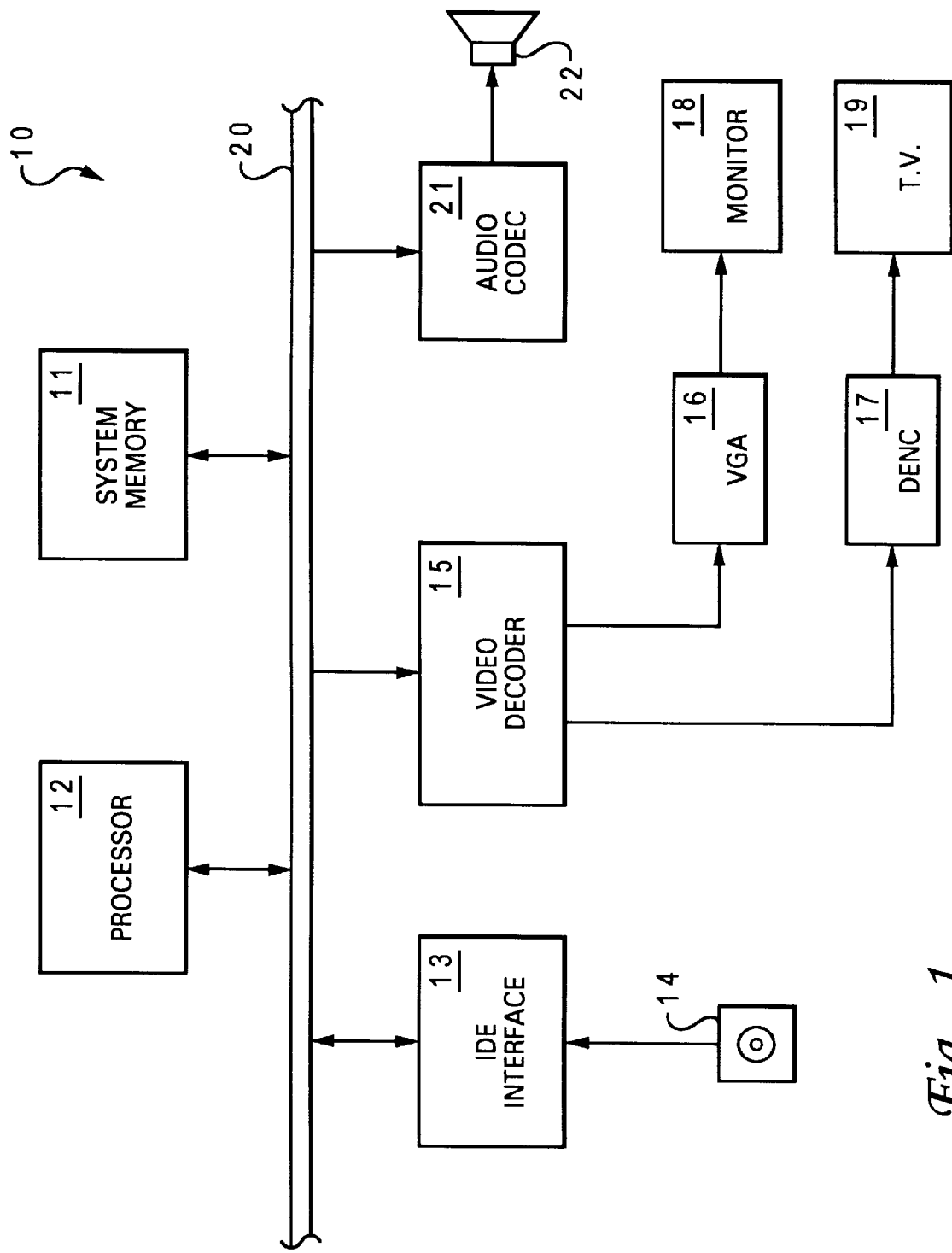
FIG. 1 is a block diagram of a digital video disk system in which a preferred embodiment of the present invention can be implemented.

Referring now to the drawings and in particular to FIG. 1, there is depicted a block diagram of a digital video disk (DVD) system in which a preferred embodiment of the present invention can be implemented. As shown, DVD system 10 includes a system memory 11 and a processor 12, in which various software are being stored and executed. These software include, inter alia, an audio/video descrambler and a dynamic audio range compressor (i.e., the subject of the present invention). System memory 11 and processor 12 are coupled to a bus 20. Also coupled to bus 20 is an Integrated Device Electronic (IDE) interface 13 for interfacing a DVD drive 14, in which a DVD disk is played, to processor 12. In addition, a video decoder 15 couples both video graphic adapter (VGA) 16 and digital encoder (DENC) 17 to bus 20 for video data delivery. VGA 16 is utilized to deliver video data to a computer monitor 18 and DENC 17 is utilized to deliver video data to a television 19. Although both VGA 16 and DENC 17 are shown in this preferred embodiment, only one of them is sufficient for common usage. As for audio delivery, an audio codec 21 receives audio data from bus 20 and sends the audio data to a speaker 22.

In order to design a dynamic audio range compression algorithm for DVD system 10 such that a uniform audio amplitude can be achieved for the entire audio spectrum, many properties are determined ahead of time. Unlike linear sample amplitude scaling, the dynamic audio range compression algorithm employs compression characteristics that respond differently to various sample amplitudes. The dynamic audio range compression algorithm is also independent of sampling frequency as well as the number of bits per sample.

Utilizing 16-bit linear pulse code modulation (PCM) audio data samples having a full sample amplitude range from −32768 to 32767 as an example, the audio output response preferably has a predominantly one-to-one linear relationship for all lower absolute sample amplitudes that are less than ten thousand and, preferably, a 3 dB attenuation for all higher absolute sample amplitudes that are more than ten thousand. Specifically, the initial linearity gradually diminishes after ten thousand until reaching the maximum sample amplitude, 32767 or −32768, at which point the preferred attenuation (i.e., 3 dB in this example) is achieved.

In other words, for a 3 dB compression scheme, the only points that are attenuated 3 dB are the limits of the amplitude range. As those values approach zero, they incur less and less attenuation until they ultimately fall within the range (i.e., from zero to ten thousand in this example) where there is virtually no attenuation.

In accordance with a preferred embodiment of the present invention, a dynamic audio range compression algorithm includes two components: a linear component with an unity slope and a non-linear component with a variable coefficient and an exponent. The dynamic audio range compression algorithm may be described in equation form as follows:

$$y(x) = Mx - LX^n \quad (1)$$

where x is the input sample amplitude and y is the output decimal sample amplitude as a function of x. M is the coefficient for the linear component that always has a value of one, which guarantees the unity slope and a one-to-one linear relationship for all lower amplitude samples until the non-linear component begins to predominate. L is the coefficient for the non-linear component, and n is the exponent for the non-linear component. To mathematically describe the behavior of the dynamic audio range compression algorithm, two boundary conditions need to be established:

$$y(0) = 0 \quad (2)$$

$$\frac{\delta y(x_{\max})}{\delta x} = 0 \quad (3)$$

where equation (2) guarantees that a zero valued amplitude sample will never experience a DC offset, and therefore the value is retained. Equation (3) effectively states that the highest input amplitude sample is subjected to the maximum desired attenuation. After the boundary conditions based on the above requirements have been established, the following relationships are derived:

$$y_{\max} = 10^{\frac{D-A}{20}} \quad (4)$$

$$n = \frac{x_{\max}}{x_{\max} - y_{\max}} \quad (5)$$

$$L = \frac{x_{\max} - y_{\max}}{x_{\max}^n} \quad (6)$$

where A is the desired attenuation in decibels, D is the maximum range in decibels for a given bit resolution, $x_{max}$ is a decimal constant representing the maximum absolute input sample amplitude, and $y_{max}$ represents the maximum absolute output decimal sample amplitude. D equals to 90.3087 for 16-bit PCM audio data samples.

The dynamic audio range compression algorithm can be implemented in various ways in an audio system. For example, in addition to typical controls such as Play, stop, Fast Forward, Rewind, etc., a DVD system such as DVD system 10 shown in FIG. 1 may contain a dynamic audio range compressor having a software or hardware dial for controlling volume output level pertaining to high amplitude audio samples. The numbers on the dial, in the range of 0 dB to 70 dB for example, represent different high-volume output control values. The 0 dB value represents no compression whatsoever for high amplitude audio samples, and the 70 dB value represents the maximum compression for high amplitude audio samples, which should be sufficient for all practical purposes because this dial setting will provide an output that is effectively inaudible to most home theater audiences as the decimal sample output amplitudes are more than three thousand times less than their corresponding input values.

During video presentation, a user can select the amount in decibels of compression desired by turning the dial to a specific high-volume output control value. This high-volume output control value is then fed into the variable A of equation (4). If the dial were set to 0 (i.e., no compression), the derived equations (1), (4), (5), and (6) will be bypassed such that the input sample is directly sent to the output as an output sample. Otherwise, attenuation factor n and non-linear coefficient L are calculated from equation (5) and equation (6) accordingly, and the attenuated output audio sample can be formed by utilizing equation (1). Both attenuation factor n and non-linear coefficient L will remain constant until dial movement is detected, in which case, $y_{max}$, n, and L are recalculated.

Figure 2:
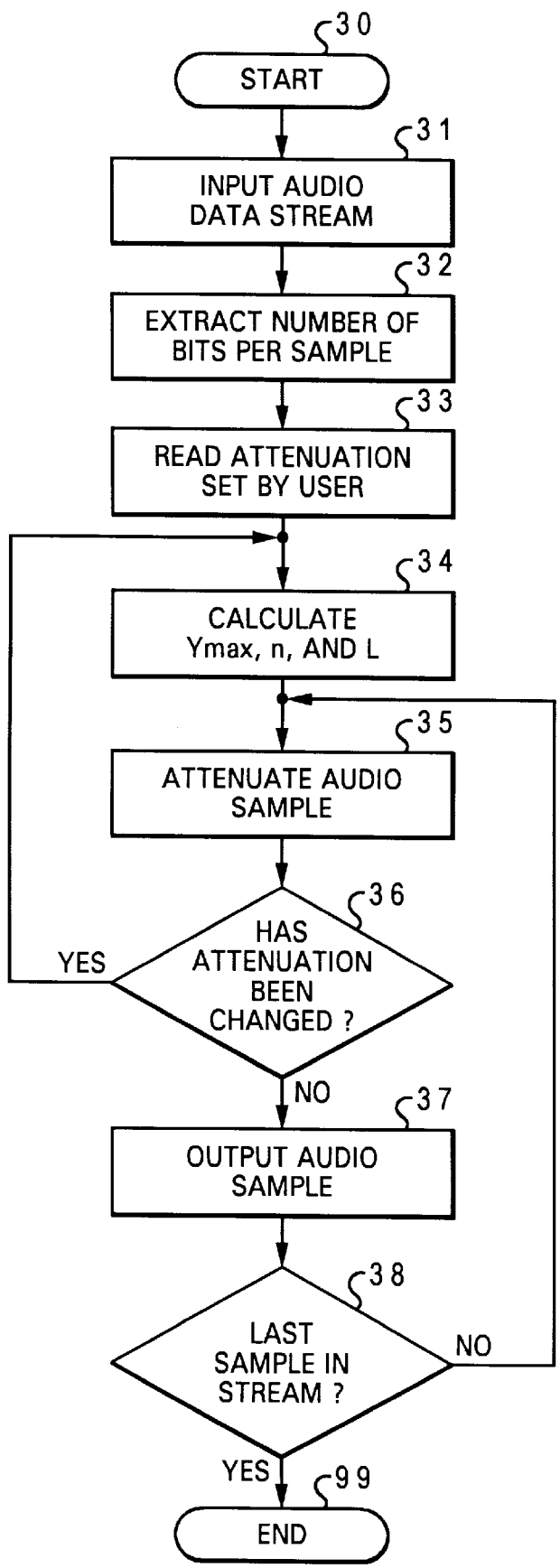
FIG. 2 is a high-level flow diagram of a method for performing a dynamic audio range compression of audio data, in accordance with the preferred embodiment of the present invention.

With reference now to FIG. 2, there is illustrated a high-level flow diagram of a method for performing a dynamic audio range compression of audio data, in accordance with the preferred embodiment of the present invention. Starting at block 30, an input audio data stream is received, as shown in block 31. The number of bits per sample for the data samples within the data stream is then extracted, as depicted in block 32. The amount of attenuation set by a user is subsequently read, as illustrated in block 33. The value of $y_{max}$, n, and L are calculated by utilizing the appropriate equations mentioned above, as shown in block 34. The audio sample is then attenuated by utilizing n and L according to equation (1), as depicted in block 35.

At this point, a determination is made as to whether or not the amount of attenuation has been changed again by the user, as illustrated in block 36. If the amount of attenuation has been changed by the user, the process returns back to block 34. However, if the amount of attenuation has not been changed, the audio sample can be output, as shown in block 37. Finally, another determination is made as to whether the last audio sample in the data stream has been encountered, as depicted in block 38. If the last audio sample has not been encountered, the process returns back to block 35 to attenuate another audio sample; otherwise, the process exits at block 99.

As has been described, the present invention provides a method and system for performing a dynamic audio range compression of audio data. With the present invention, audio data can be dynamically compressed in a way that high amplitude audio data get compressed by a user-selectable amount while low amplitude audio data remain unaffected.

It is also important to note that although the present invention has been described in the context of a fully functional DVD system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for selectively and variably attenuating audio data, said method comprising the steps of:

receiving a high-volume output control value as selected by a user, wherein said high-volume output control value defines a volume output level for high amplitude audio samples;

determining an attenuation factor utilizing said high-volume output control value by calculating $$y_{\max} = 10^{\frac{D-A}{20}}$$

$$n = \frac{x_{\max}}{x_{\max} - y_{\max}}$$

$$L = \frac{x_{\max} - y_{\max}}{x_{\max}^n}$$

wherein A is said high-volume output control value in decibels, D is the maximum decibel range, $x_{max}$ represents the maximum absolute input sample amplitude, $y_{max}$ represents the maximum absolute output decimal sample amplitude, L is a coefficient, and n is said attenuation factor;

attenuating each sample from an incoming audio data stream with said attenuation factor; and outputting said attenuated samples.

2. The method according to claim 1, wherein said attenuating step further includes calculating $$y(x) = Mx - Lx^n$$

wherein x is an input sample amplitude and y is an output decimal sample amplitude as a function of said x, M is a coefficient for the linear component.

3. The method according to claim 2, wherein said M equals one.

4. An audio system capable of selectively and variably attenuating audio data, comprising:

means for receiving a high-volume output control value as selected by a user, wherein said high-volume output control value defines a volume output level for high amplitude audio samples;

means for determining an attenuation factor utilizing said high-volume output control value by calculating $$y_{\max} = 10^{\frac{D-A}{20}}$$

$$n = \frac{x_{\max}}{x_{\max} - y_{\max}}$$

$$L = \frac{x_{\max} - y_{\max}}{x_{\max}^n}$$

wherein A is said high-volume output control value in decibels, D is the maximum decibel range, $x_{max}$ represents the maximum absolute input sample amplitude, $y_{max}$ represents the maximum absolute output decimal sample amplitude, L is a coefficient, and n is said attenuation factor;

means for attenuating each sample from an incoming audio data stream with said attenuation factor; and means for outputting said attenuated samples.

5. The audio system according to claim 4, wherein said attenuating means further includes a means for calculating $$y(x) = Mx - Lx^n$$

wherein x is an input sample amplitude and y is an output decimal sample amplitude as a function of said x, M is a coefficient for the linear component.

6. The audio system according to claim 5, wherein said M equals one.

7. A computer program product residing on a computer usable medium for selectively and variably attenuating audio data, said computer program product comprising:

program code means for receiving a high-volume output control value as selected by a user, wherein said high-volume output control value defines a volume output level for high amplitude audio samples;

program code means for determining an attenuation factor utilizing said high-volume output control value by calculating $$y_{\max} = 10^{\frac{D-A}{20}}$$

$$n = \frac{x_{\max}}{x_{\max} - y_{\max}}$$

$$L = \frac{x_{\max} - y_{\max}}{x_{\max}^n}$$

wherein A is said high-volume output control value in decibels, D is the maximum decibel range, $x_{max}$ represents the maximum absolute input sample amplitude, $y_{max}$ represents the maximum absolute output decimal sample amplitude, L is a coefficient, and n is said attenuation factor;

program code means for attenuating each sample from an incoming audio data stream with said attenuation factor; and program code means for outputting said attenuated samples.

8. The computer program product according to claim 7, wherein said program code means for attenuating further includes a program code means for calculating $$y(x) = Mx - Lx^n$$

wherein x is an input sample amplitude and y is an output decimal sample amplitude as a function of said x, M is a coefficient for the linear component.

9. The computer program product according to claim 8, wherein said M equals one.

* * * * *